United States Patent
Dash et al.

(10) Patent No.: US 10,864,527 B2
(45) Date of Patent: Dec. 15, 2020

(54) METHOD FOR MONITORING THE SIGNAL QUALITY OF AN ELECTROSTATIC PRECIPITATOR AND ELECTROSTATIC PRECIPITATOR

(71) Applicant: GENERAL ELECTRIC TECHNOLOGY GMBH, Baden (CH)

(72) Inventors: Nanda Kishore Dash, Odisha (IN); Niraj Kumar Singh, West Bengal (IN); Inger Elisabeth Önnerby Pettersson, Vaxjo (SE); Carl Marcus Williamsson, Ljungby (SE)

(73) Assignee: GENERAL ELECTRIC TECHNOLOGY GMBH, Baden (CH)

(*) Notice: Subject to any disclaimer, the term of this patent is extended or adjusted under 35 U.S.C. 154(b) by 132 days.

(21) Appl. No.: 15/154,005

(22) Filed: May 13, 2016

(65) Prior Publication Data
US 2016/0339448 A1   Nov. 24, 2016

(30) Foreign Application Priority Data

May 20, 2015 (IN) .......................... 1422/DEL/2015

(51) Int. Cl.
*B03C 3/68* (2006.01)
*B03C 3/04* (2006.01)
(Continued)

(52) U.S. Cl.
CPC ................. *B03C 3/68* (2013.01); *B03C 3/04* (2013.01); *G01R 21/00* (2013.01); *G01R 29/26* (2013.01)

(58) Field of Classification Search
CPC combination set(s) only.
See application file for complete search history.

(56) References Cited

U.S. PATENT DOCUMENTS 3,363,402 A * 1/1968 Taylor ...................... B03C 3/68
                                                                     323/903
3,374,609 A * 3/1968 Kide ......................... B03C 3/68
                                                                     323/903
(Continued)

FOREIGN PATENT DOCUMENTS

GB        1402149 A  *  8/1975  ............... B03C 3/68
JP        9308240   * 11/1997   ............... H02M 3/28
JP    2001-300348 A   10/2001

OTHER PUBLICATIONS

Gabriel N. Popa et al.; "A Prospective on Power Quality Analyze of Three Sections Plate-Type Electrostatic Precipitator Supplies," Apr. 18, 2012 (Apr. 18, 2012); Proceedings 11th WSEAS Int'l Conf, Recent Researches in Circuits, Systems, Multimedia Control; ISBN 978-1-61804-085-5; pp. 49-54.*

(Continued)

*Primary Examiner* — Christopher P Jones
*Assistant Examiner* — Sonji Turner
(74) *Attorney, Agent, or Firm* — Armstrong Teasdale LLP

(57) ABSTRACT

The method for monitoring the signal quality of an electrostatic precipitator comprises measuring in real time at least one feature of a primary electric power sent to a transformer of the electrostatic precipitator and/or at least one feature of a secondary electric power sent to the collecting electrodes and discharge electrodes of the electrostatic precipitator, elaborating the at least a measured feature generating an information indicative of the electrostatic precipitation signal quality, providing the information.

7 Claims, 2 Drawing Sheets

(51) Int. Cl.
*G01R 21/00* (2006.01)
*G01R 29/26* (2006.01)

(56) References Cited

U.S. PATENT DOCUMENTS

| | | | | | |
|---|---|---|---|---|---|
| 3,443,358 | A * | 5/1969 | Thomas | ............... | B03C 3/66 315/291 |
| 3,504,479 | A * | 4/1970 | Coe, Jr. | ............... | B03C 3/68 315/326 |
| 3,641,740 | A * | 2/1972 | Schumann | ............... | B03C 3/68 315/209 SC |
| 3,772,853 | A * | 11/1973 | Burge | ............... | B03C 3/66 323/246 |
| 3,984,757 | A * | 10/1976 | Gott | ............... | H03K 17/962 323/326 |
| 4,061,961 | A * | 12/1977 | Baker | ............... | B03C 3/68 323/239 |
| 4,267,502 | A * | 5/1981 | Reese | ............... | B03C 3/68 323/237 |
| 4,521,228 | A * | 6/1985 | Daar | ............... | B03C 3/68 323/903 |
| 4,605,424 | A * | 8/1986 | Johnston | ............... | B03C 3/68 363/81 |
| 4,751,401 | A * | 6/1988 | Beigel | ............... | H03K 17/79 307/115 |
| 4,860,149 | A * | 8/1989 | Johnston | ............... | B03C 3/68 361/79 |
| 5,378,978 | A * | 1/1995 | Gallo | ............... | B03C 3/68 323/241 |
| 5,591,249 | A * | 1/1997 | Hankins | ............... | B03C 3/013 95/58 |
| 5,631,818 | A * | 5/1997 | Johnson | ............... | B03C 3/66 363/125 |
| 5,639,294 | A * | 6/1997 | Ranstad | ............... | B03C 3/68 323/903 |
| 6,282,106 | B2 * | 8/2001 | Grass | ............... | B03C 3/66 323/903 |
| 6,461,405 | B2 * | 10/2002 | Reyes | ............... | B03C 3/68 323/903 |
| 6,721,345 | B2 * | 4/2004 | Bragin | ............... | H01S 3/225 372/57 |
| 6,839,251 | B2 * | 1/2005 | Johnston | ............... | B03C 3/68 323/903 |
| 6,937,455 | B2 * | 8/2005 | Krichtafovitch | ............... | B03C 3/68 361/230 |
| 7,452,403 | B2 * | 11/2008 | Younsi | ............... | B03C 3/08 323/903 |
| 7,594,958 | B2 * | 9/2009 | Krichtafovitch | ............... | B03C 3/68 315/506 |
| 7,606,543 | B1 | 10/2009 | Seppanen | | |
| 8,007,566 | B2 * | 8/2011 | Abdelkrim | ............... | B03C 3/08 95/5 |
| 8,233,255 | B1 * | 7/2012 | Ford | ............... | B03C 3/68 361/235 |
| 8,797,707 | B2 * | 8/2014 | Ford | ............... | B03C 3/68 361/235 |
| 2004/0004797 | A1 | 1/2004 | Krichtafovitch et al. | | |
| 2008/0264249 | A1 * | 10/2008 | Truce | ............... | B03C 3/68 95/6 |

OTHER PUBLICATIONS

Gargoom and et. al.; Automatic Classification and Characterization of Power Quality Events; Oct. 4, 2008; IEEE Transactions on Power Delivery, vol. 23, No. 4; 2417-2425.*

Gabriel N. Popa et al.; "A Prospective on Power Quality Analyze of Three Sections Plate-Type Electrostatic Precipitator Supplies," Apr. 18, 2012 (Apr. 18, 2012); Proceedings 11th WSEAS Int'l Conf, Recent Researches in Circuits, Systems, Multimedia Control; ISBN 978-1-61804-085-5; pp. 49-54. (Year: 2012).* https://calcworkshop.com/application-derivatives/application-derivatives-lesson-1/; Jul. 12, 2017. (Year: 2017).*

Grass, N., "Electrostatic precipitator diagnostics based on flashover characteristics," Conference Record of the 2005 IEEE Industry Applications Conference Fortieth IAS Annual Meeting, Oct. 2-6, 2005, Kowloon, Hong Kong, China, IEEE vol. 4, Oct. 2, 2005, pp. 2573-2577.

Popa, G.N. et al., "A Prospective on Power Quality Analyze of Three Sections Plate-Type Electrostatic Precipitator Supplies," IMMURO'12 Proceedings of the 11th WSEAS international conference on Instrumentation, Measurement, Circuits and Systems, and Proceedings of the 12th WSEAS international conference on Robotics, Control and Manufacturing Technology, and Proceedings of the 12th WSEAS international conference on Multimedia Systems & Signal Processing, Apr. 18, 2012, pp. 49-54.

Extended European Search Report and Opinion issued in connection with corresponding EP Application No. 15177278.7 dated Oct. 12, 2016.

* cited by examiner

METHOD FOR MONITORING THE SIGNAL QUALITY OF AN ELECTROSTATIC PRECIPITATOR AND ELECTROSTATIC PRECIPITATOR

CROSS-REFERENCE TO RELATED APPLICATIONS

This application claims priority to Indian Application No. 1422/DEL/2015 filed May 20, 2015, the contents of which are hereby incorporated in its entirety.

TECHNICAL FIELD

The present invention relates to a method for monitoring the signal quality of an electrostatic precipitator and electrostatic precipitator.

BACKGROUND

Electrostatic precipitators comprise collecting electrodes and discharge electrodes that are supplied with electric power by a transformer connected to the electric grid.

During operation it is useful to supply the collecting electrodes and discharge electrodes with high electric power (e.g. current intensity) because this improves dust collection at the collecting electrodes.

In addition, it is important to limit the electric power (e.g. current intensity) supplied to the collecting electrodes and discharge electrodes, because a too high electric power (e.g. current) can cause sparks. Sparks cause the discharge of the energy accumulated in the collecting electrodes and discharge electrodes and thus must typically be avoided (but in some processes controlled sparks can be beneficial).

Traditionally, the signal quality of the features (e.g. current, voltage) of the electric power supplied by the electric grid to the transformer (primary features) and signal quality of the features (e.g. current, voltage) of the electric power supplied by the transformer to the collecting electrodes and discharge electrodes (secondary features) are only measured before the electrostatic precipitator is operated (e.g. during tests carried out after installation of the electrostatic precipitator but before starting operation).

For this reason it is not possible to detect possible troubles or damages or bad signal quality that can cause a non-optimal operation of the electrostatic precipitator; e.g. troubles or damages or bad signal quality can occur at the electric grid and/or transformer and/or cables connecting the transformer to the electric grid and to the collecting electrodes and discharge electrodes.

In addition, the measurements are done using an external oscilloscope by trained personnel.

SUMMARY

An aspect of the invention includes providing a method and an electrostatic precipitator that permit detection of bad signal quality also after installation, when the electrostatic precipitator is actually used.

Another aspect of the invention includes providing a method and an electrostatic precipitator that permit detection of bad signal quality without external equipment and without the need of trained personnel.

These and further aspects are attained by providing a method and an electrostatic precipitator in accordance with the accompanying claims.

BRIEF DESCRIPTION OF THE DRAWINGS

Further characteristics and advantages will be more apparent from the description of a preferred but non-exclusive embodiment of the method and electrostatic precipitator, illustrated by way of non-limiting example in the accompanying drawings, in which.

DETAILED DESCRIPTION OF EXEMPLARY EMBODIMENTS

Figure 1:
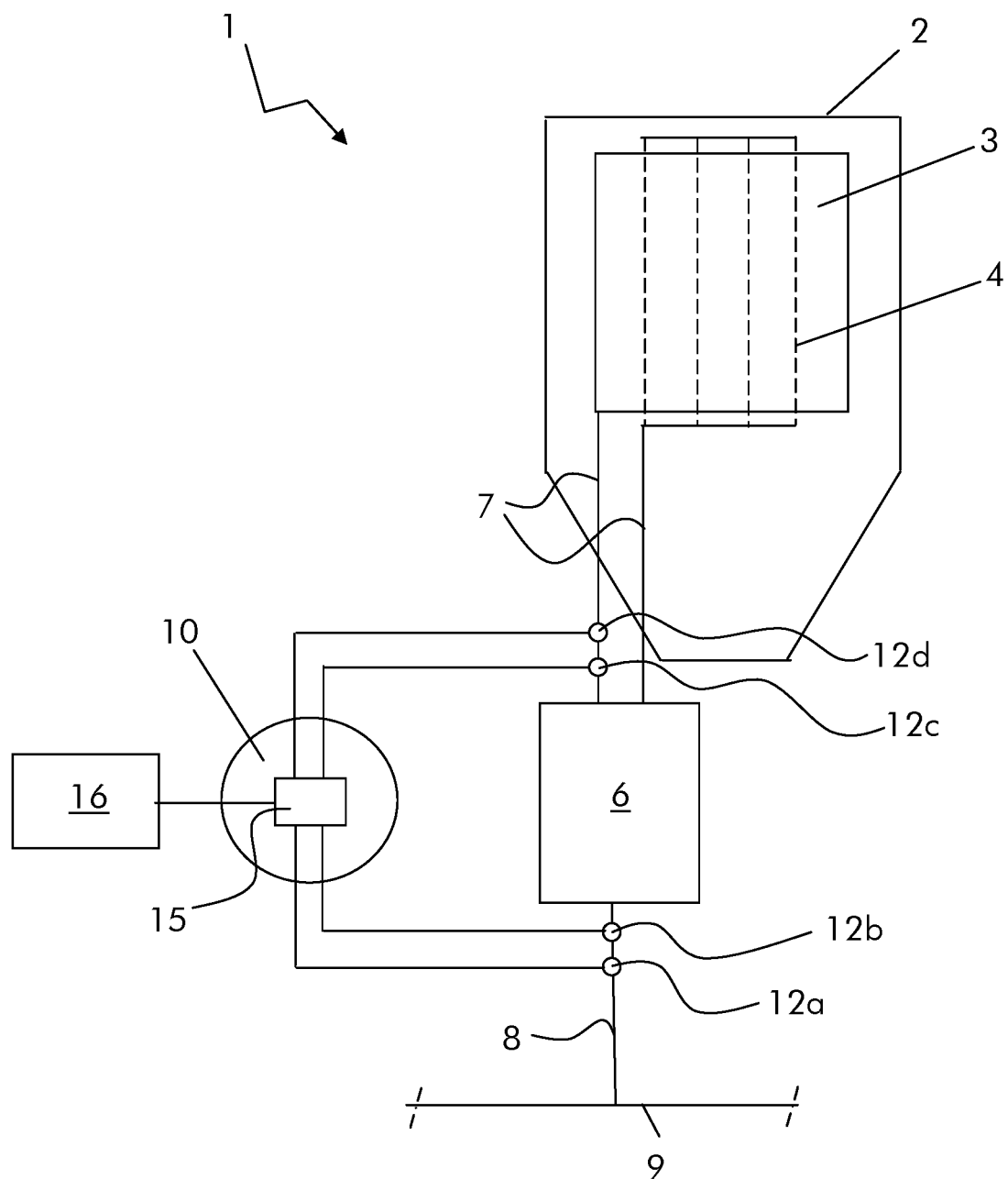
FIG. 1 shows and embodiment of an electrostatic precipitator.

In the following the electrostatic precipitator 1 is described first.

The electrostatic precipitator 1 has a casing 2 that houses collecting electrodes 3, e.g. having plate shape, and discharge electrodes 4, e.g. having rectilinear shape and defined by bars or cables.

The electrostatic precipitator 1 further comprises a transformer 6; the transformer 6 is connected via cables 7 to the collecting electrodes 3 and discharge electrodes 4. The transformer 6 is also connected via cables 8 to the electric grid 9. The transformer 6 is provided with primary electric power from the electric grid 9 and provides secondary electric power to the collecting electrodes 3 and discharge electrodes 4.

The electrostatic precipitator further comprises a controller 10 connected to the transformer 6, for driving the transformer.

The electrostatic precipitator further has one or more sensors 12*a*-*d* for measuring in real time at least one feature of the primary electric power and/or at least one feature of the secondary electric power.

The sensors can comprise:
a voltage sensor 12*a*, such as a voltmeter, connected to the cable 8;
a current sensor 12*b*, such as an ammeter, connected to the cable 8;
a voltage sensor 12*c*, such as a voltmeter, connected to the cable 7;
a current sensor 12*d*, such as an ammeter, connected to the cable 7.

In addition, the electrostatic precipitator 1 comprises a control unit 15 for elaborating the measured feature generating information indicative of the signal quality and an interface 16, such as a monitor, for providing the information.

In a preferred embodiment, the control unit 15 is part of or is embedded in the controller 10.

This electrostatic precipitator 1 can implement a method comprising measuring in real time at least one feature of the primary electric power and/or at least one feature of the secondary electric power.

The measurement is made in real time, i.e. during the operation of the electrostatic precipitator 1 and the measured features are supplied to the control unit 15. One or more features can be detected, such as current and/or voltage of the electric power; in addition the features of the electric power passing through the cables 7 or cables 8 or both cables 7 and 8 is possible.

The method further comprises elaborating the measured features generating information indicative of the signal quality. The control unit (or controller) can have an analog/ digital converter, such that the control unit 15 has to elaborate a digital signal. The control unit is preferably a computer system such that signal elaboration can be easily made by programming the computer system.

The method further comprises providing the information; this can be done by showing the information on the monitor 16. In addition or as an alternative the information can be provided to users that generate reports (e.g. automatic users) or systems that activate an alarm, e.g. in case the information differs from what expected.

Different possibilities are available for the electric power feature that is measured and for elaborating the measured feature; any of the examples explained below can be implemented alone or in combination with the others.

First Example

Figure 2:
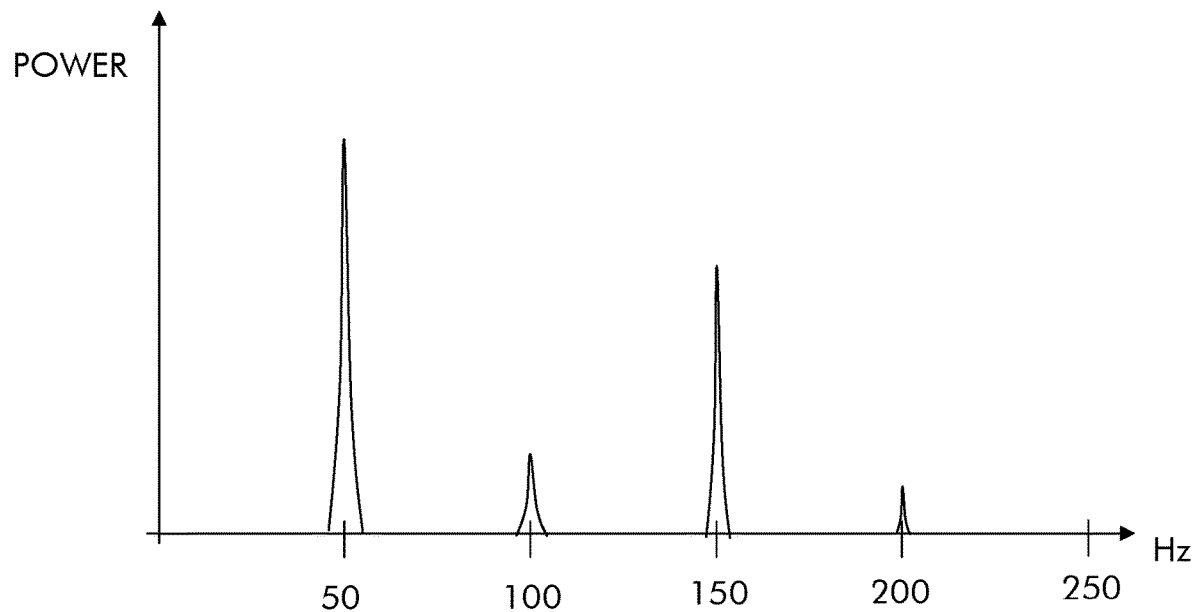
FIG. 2 shows a spectrum analysis of a primary voltage.

In a first example, the feature is the primary voltage, and elaborating comprises obtaining the spectrum analysis (e.g. by fast Fourier transform, e.g. shown in FIG. 2) of the primary voltage.

For the primary voltage it is expected that the harmonics are placed on 1 and 3 times the primary voltage frequency; thus if the primary voltage frequency is e.g. 50 Hz, the first harmonic is expected at 50 Hz and the second harmonic at 150 Hz.

Than information is generated by calculating the percentage of power associated to given harmonics, such as the first harmonic (e.g. 50 Hz) and second harmonic (i.e. 150 Hz), with respect to the total power associated to all harmonics.

The information can be:
  GOOD (for a frequency analysis over or equal to 90, i.e. the first and second harmonics carry at least 90% of the power of all harmonics),
  OK or MEDIUM (for a frequency analysis over or equal to 80),
  BAD (for a frequency analysis below 80).

From this information it is possible to ascertain whether noise in included in the primary voltage; in fact if the information is GOOD there is no or limited noise that could hinder the electrostatic precipitation operation. In case the information is BAD the electric grid and/or the transformer 6 and/or the cables 8 could be defective or could incorrectly operate and generate undesired and unexpected harmonics.

Second Example

In a second example, the feature is the primary voltage and elaborating comprises calculating the zero cross deviation of the primary voltage.

Figure 3:
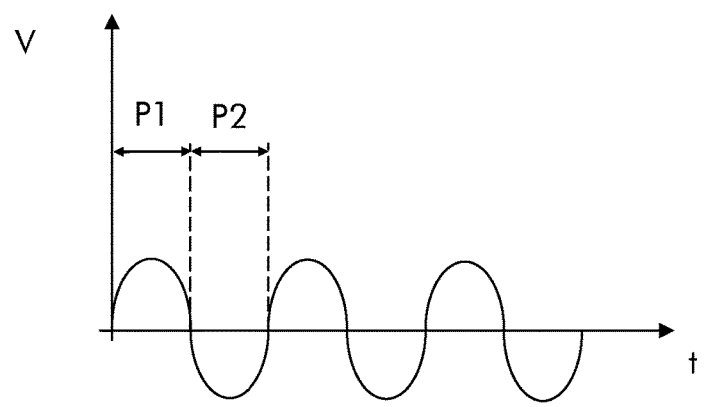
FIG. 3 shows the voltage/time relationship for the primary voltage.

FIG. 3 shows the voltage and in particular shows the zero cross of the voltage, i.e. when the voltage is zero.

The zero cross deviation can be calculated by measuring the maximum half cycle time (Pmax) and the minimum half cycle time (Pmin), calculating their difference and subtracting the sampling error (twice the sampling period T). This value can be multiplied by 100.

The formula for calculating the zero cross deviation is thus:

$$ZCD = P\max - P\min - 2T$$

wherein
ZCD is the zero cross deviation,
Pmax is the measured largest half cycle time between P1 and P2,
Pmin is the smallest measured half cycle time between P1 and P2,
T is sampling period (for example for 1200 samples/minute).

If for example P1=Pmin=11T ms and P2=Pmax=13T ms the zero cross deviation is 0 ms.

The information regarding the zero cross deviation can be:
  GOOD (for a zero cross deviation below or equal to 0.5 ms),
  OK or MEDIUM (for a zero cross deviation below or equal to 1 ms),
  BAD (for a zero cross deviation over 1 ms).

The zero cross can be used as a reference at the controller 10 for driving the transformer 6; for example the zero cross is used as a reference to drive the transformer 6 for it to send current pulses to the collecting electrodes 3 and discharge electrodes 4. Thus the zero cross deviation indicates that there are no substantial disturbances around the zero cross that could affect the performances of the electrostatic precipitator.

Third Example

In a third example the feature is the secondary voltage and elaborating comprises obtaining the spectrum analysis of the secondary voltage.

The analysis is the same as that of the primary voltage, but in this case other frequencies are expected to be seen. In particular, harmonics are expected at 2 and 4 times the primary voltage frequency; thus if the primary voltage frequency is e.g. 50 Hz, the first harmonic is expected at 100 Hz and the second harmonic at 200 Hz.

The information is elaborated by calculating the percentage of the power associated to given harmonics, such as the first harmonic (e.g. 100 Hz) and second harmonic (e.g. 200 Hz), with respect to the total power associated to all harmonics. The information can be:
  GOOD (for a frequency analysis over or equal to 90, i.e. the first and second harmonics carry at least 90% of the power of all harmonics),
  OK or MEDIUM (for a frequency analysis over or equal to 80),
  BAD (for a frequency analysis below 80).

If the signal is classified as bad, it is not recommended to use the optimization algorithm to calculate the corona time and corona voltage.

Fourth Example

In a fourth example the feature is the secondary voltage and the information comprises the derivative of the secondary voltage with respect to time dV/dt.

The information takes the maximum negative derivative dV/dt during the sampling time; all positive dV/dt are ignored. The information can be:
  GOOD (for a dV/dt below or equal to 25 kV/ms),
  OK or MEDIUM (for a dV/dt between 25-35 kV/ms),
  BAD (for a dV/dt over or equal to 35 kV/ms).

This analysis can give an indication whether the secondary voltage can be accurately used for sparks detection. If under normal conditions the derivative is too high, the threshold for spark detection needs to be set to a high level in order to not get false detections of sparks. When a high threshold is set, the controller could ignore sparks.

Fifth Example

In a fifth example the feature is the primary current and elaborating comprises obtaining the spectrum analysis of the primary current.

The analysis is the same as that of the primary voltage. In this case harmonics are expected at 1 and 3 and 5 times the frequency of the primary current. For example, in case the primary current frequency is 60 Hz, harmonics are expected at 60 Hz, 180 Hz, 300 Hz.

The information is generated by calculating the percentage of the power associated to given harmonics, such as the first harmonic (e.g. 60 Hz), second harmonic (e.g. 180 Hz) and third harmonic (e.g. 300 Hz), with respect to the total power associated to all harmonics. The information can be:
GOOD (for a frequency analysis over or equal to 84, i.e. the first, second and third harmonics carry at least 84% of the power of all harmonics),
OK or MEDIUM (for a frequency analysis over or equal to 73),
BAD (for a frequency analysis below 73).

If the signal is classified as bad, it is not recommended to use the optimization algorithm to calculate the corona time and corona voltage.

Sixth Exaple

In a sixth example the feature is the secondary current and elaborating comprises obtaining the spectrum analysis of the secondary current.

The analysis is the same as that of the primary voltage. In this case harmonics are expected at 2 and 3 times the frequency of the primary current. For example, in case the primary current frequency is 60 Hz, harmonics are expected at 120 Hz, 240 Hz.

Also in this case the information is generated by calculating the percentage of the power associated to given harmonics, such as the first harmonic (e.g. 120 Hz) and second harmonic (e.g. 240 Hz), with respect to the total power associated to all harmonics. The information can be:
GOOD (for a frequency analysis over or equal to 86, i.e. the first and second harmonics carry at least 86% of the power of all harmonics),
OK or MEDIUM (for a frequency analysis over or equal to 74),
BAD (for a frequency analysis below 74).

On the basis of the information, it is possible a regulation of the electrostatic precipitator, either manual or automatic. In addition it is possible to set up for maintenance works to be done during outages of the power plant.

Naturally the features described may be independently provided from one another.

The invention claimed is:

1. A method for monitoring power quality of an electrostatic precipitator that is equipped with collecting electrodes and discharge electrodes, said method comprising:
electrically connecting the discharge electrodes to a transformer;
connecting the transformer to a controller;
supplying the transformer with primary electric power from an electric grid;
supplying secondary electric power from the transformer to the discharge electrodes;
measuring, with at least one first sensor, at least one primary feature of the primary electric power supplied to the transformer in real time during operation of the electrostatic precipitator to obtain at least a measured primary feature;
measuring, with at least one second sensor, at least one secondary feature of the secondary electric power supplied to the collecting electrodes and discharge electrodes in real time during operation of the electrostatic precipitator to obtain at least a measured secondary feature;
calculating a zero cross deviation of a primary voltage, in units of time, based on the at least one measured primary feature of the primary electric power, the zero cross deviation indicating disturbances around a zero cross that could affect a performance of the electrostatic precipitator;
providing, via the controller, when the zero cross deviation is over a zero cross deviation time value;
obtaining a spectrum analysis of a secondary voltage of the transformer; and
calculating, using the obtained spectrum analysis of the secondary voltage, a percentage of power associated to given harmonics with respect to power associated to all harmonics of the secondary voltage, by at least one of
calculating a derivative of the secondary voltage with respect to time and selecting a maximum negative derivative of the secondary voltage to determine whether the secondary voltage can be used for sparks detection, and
obtaining a spectrum analysis of a secondary current of the transformer and calculating a percentage of power associated to given harmonics with respect to power associated to all harmonics of the secondary current;
alarming, via the controller, when at least one of the calculated derivative is outside a derivative value, and the percentage of power associated to given harmonics is outside a secondary current harmonic percent value;
determining information indicative of the power quality using the measured primary feature and the measured secondary feature;
operating the controller to cause the transformer to transmit current pulses to the discharge electrodes based on the determined power quality information; and
providing the information via the controller, at least one of displaying the determined power quality information on a monitor, generating a report including the determined power quality information, and activating an alarm, when the determined power quality information is outside a predetermined range of values.

2. The method of claim 1, wherein the at least one primary feature of the primary electric power and the at least one secondary feature of the secondary electric power are at least one of voltage and current.

3. The method of claim 1, wherein the at least one primary feature is a primary voltage, the method further comprising:
obtaining a spectrum analysis of the primary voltage;
calculating a percentage of power associated to given harmonics with respect to power associated to all harmonics of the primary voltage; and
alarming, via the controller, when the percentage of power associated to given harmonics is outside a primary voltage harmonic percent value.

4. The method of claim 1, wherein the at least one primary feature is a primary current, and wherein calculating the zero cross deviation of a primary voltage further comprises obtaining a spectrum analysis of the primary current and calculating a percentage of power associated to given harmonics with respect to power associated to all harmonics of the primary current.

5. An electrostatic precipitator comprising:
a transformer;
collecting electrodes;

discharge electrodes electrically connected to the transformer;

an electric grid supplying primary electric power to the transformer, and the transformer supplying secondary electric power to the discharge electrodes;

a controller connected to the transformer;

at least one first sensor for measuring, in real time, during operation of the electrostatic precipitator, at least one primary feature of the primary electric power supplied to the transformer to obtain at least a measured primary feature;

at least one second sensor for measuring, in real time, during operation of the electrostatic precipitator at least one secondary feature of the secondary electric power supplied to the discharge electrodes to obtain at least a measured secondary feature;

a control unit for calculating information indicative of power quality based on the measured primary feature and the measured secondary feature;

the control unit operative to calculate, based on the at least one measured feature of the primary electric power, a zero cross deviation of the primary voltage, in units of time, the zero cross deviation indicating disturbances around a zero cross that could affect a performance of the electrostatic precipitator;

the control unit operative to calculate, based on the at least one measured feature of the secondary electric power, at least one of a spectrum analysis of the secondary voltage and a percentage of power associated to given harmonics with respect to power associated to all harmonics of the secondary voltage, a derivative of the secondary voltage with respect to time and selection of a maximum negative derivative of the secondary voltage, and a spectrum analysis of a secondary current and calculating a percentage of power associated to given harmonics with respect to power associated to all harmonics of the secondary current; and an interface for providing the information via the controller, operating the controller to cause the transformer to transmit current pulses to the discharge electrodes based on the information calculated by the control unit.

6. The electrostatic precipitator of claim 5, wherein the control unit is at least one of a part of the controller and is embedded in the controller.

7. The electrostatic precipitator of claim 5, wherein the interface comprises a monitor, a user interface that generates a report, or systems that generate an alarm.

* * * * *